(12) United States Patent
Cheng et al.

(10) Patent No.: US 9,293,474 B2
(45) Date of Patent: Mar. 22, 2016

(54) DUAL CHANNEL HYBRID SEMICONDUCTOR-ON-INSULATOR SEMICONDUCTOR DEVICES

(71) Applicants: International Business Machines Corporation, Armonk, NY (US); STMicroelectronics, Inc., Coppell, TX (US); Commissariat A l'Energie atomique et aux Energies alternatives, Grenoble Cedex 9 (FR)

(72) Inventors: Kangguo Cheng, Schenectady, NY (US); Bruce B. Doris, Brewster, NY (US); Ali Khakifirooz, Los Altos, CA (US); Qing Liu, Guilderland, NY (US); Laurent Grenouillet, Rives (FR); Yannick Le Tiec, Crolles (FR); Maud Vinet, Albany, NY (US)

(73) Assignees: INTERNATIONAL BUSINESS MACHINES CORPORATION, Armonk, NY (US); COMMISSARIAT A L'ENERGIE ATOMIQUE ET AUX ENERGIES ALTERNATIVES, Grenoble Cedex 9 (FR); STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 14/739,736
(22) Filed: Jun. 15, 2015
(65) Prior Publication Data
US 2015/0279861 A1 Oct. 1, 2015

Related U.S. Application Data

(62) Division of application No. 13/933,642, filed on Jul. 2, 2013, now Pat. No. 9,059,041.

(51) Int. Cl.
*H01L 27/12* (2006.01)
*H01L 21/762* (2006.01)
(Continued)

(52) U.S. Cl.
CPC ...... *H01L 27/1207* (2013.01); *H01L 21/76224* (2013.01); *H01L 21/76283* (2013.01);
(Continued)

(58) Field of Classification Search
CPC ............ H01L 27/1207; H01L 27/1608; H01L 27/0679
See application file for complete search history.

(56) References Cited

U.S. PATENT DOCUMENTS 5,894,152 A 4/1999 Jaso et al.
6,214,653 B1 4/2001 Chen et al.
(Continued)

OTHER PUBLICATIONS

Le Royer, C. et al., "First demonstration of ultrathin body c-SiGe channel FDSOI pMOSFETs combined with SiGe(:B) RSD: Drastic improvement of electrostatics (Vth,p tuning, DIBL) and transport (µ10, Isat) properties down to 23nm gate length" IEEE International Electron Devices Meeting (IEDM) (Dec. 5-7, 2011) pp. 16.5.1-16.5.4.

(Continued)

*Primary Examiner* — Mamadou Diallo
(74) *Attorney, Agent, or Firm* — Scully, Scott, Murphy & Presser, P.C.; Vazken Alexanian

(57) ABSTRACT

Trenches are formed through a top semiconductor layer and a buried insulator layer of a semiconductor-on-insulator (SOI) substrate. A selective epitaxy is performed to form bulk semiconductor portions filling the trenches and in epitaxial alignment with the semiconductor material of a handle substrate. At least one dielectric layer is deposited over the top semiconductor layer and the bulk semiconductor portions, and is patterned to form openings over selected areas of the top semiconductor layer and the bulk semiconductor portions. A semiconductor alloy material is deposited within the openings directly on physically exposed surfaces of the top semiconductor layer and the bulk semiconductor portions. The semiconductor alloy material intermixes with the underlying semiconductor materials in a subsequent anneal. Within each of the SOI region and the bulk region, two types of semiconductor material portions are formed depending on whether a semiconductor material intermixes with the semiconductor alloy material.

14 Claims, 7 Drawing Sheets

(51) Int. Cl.
  *H01L 21/84* (2006.01)
  *H01L 29/06* (2006.01)
  *H01L 29/16* (2006.01)
  *H01L 29/161* (2006.01)
  *H01L 21/02* (2006.01)

(52) U.S. Cl.
  CPC .......... *H01L21/84* (2013.01); *H01L 29/0649* (2013.01); *H01L 29/161* (2013.01); *H01L 29/1608* (2013.01); *H01L 21/0262* (2013.01); *H01L 21/02529* (2013.01); *H01L 21/02532* (2013.01)

(56) References Cited

U.S. PATENT DOCUMENTS

| | | | |
|---|---|---|---|
| 6,600,170 | B1 | 7/2003 | Xiang |
| 6,835,981 | B2 | 12/2004 | Yamada et al. |
| 7,268,024 | B2 | 9/2007 | Yeo et al. |
| 7,282,402 | B2 | 10/2007 | Sadaka et al. |
| 7,682,941 | B2 | 3/2010 | Anderson et al. |
| 2006/0113605 | A1* | 6/2006 | Currie ............ H01L 21/823807 257/368 |
| 2008/0020515 | A1 | 1/2008 | White et al. |
| 2008/0274595 | A1 | 11/2008 | Spencer et al. |
| 2008/0303090 | A1* | 12/2008 | Ieong ............ H01L 21/823807 257/351 |
| 2009/0108302 | A1 | 4/2009 | Narasimha et al. |
| 2009/0258464 | A1 | 10/2009 | Camillo-Castillo et al. |
| 2013/0062696 | A1 | 3/2013 | Di et al. |

OTHER PUBLICATIONS

Khakifirooz, A. et al., "Strain Engineering for Fully-Depleted SOI Devices" ECS Trans. (Oct. 13, 2010) pp. 489-499, vol. 33, No. 6.
Cheng, K. et al., "Fully depleted extremely thin SOI technology fabricated by a novel integration scheme featuring implant-free, zero-silicon-loss, and faceted raised source/drain" 2009 Symposium on VLSI Technology (Jun. 16-18, 2009) pp. 212-213.

* cited by examiner

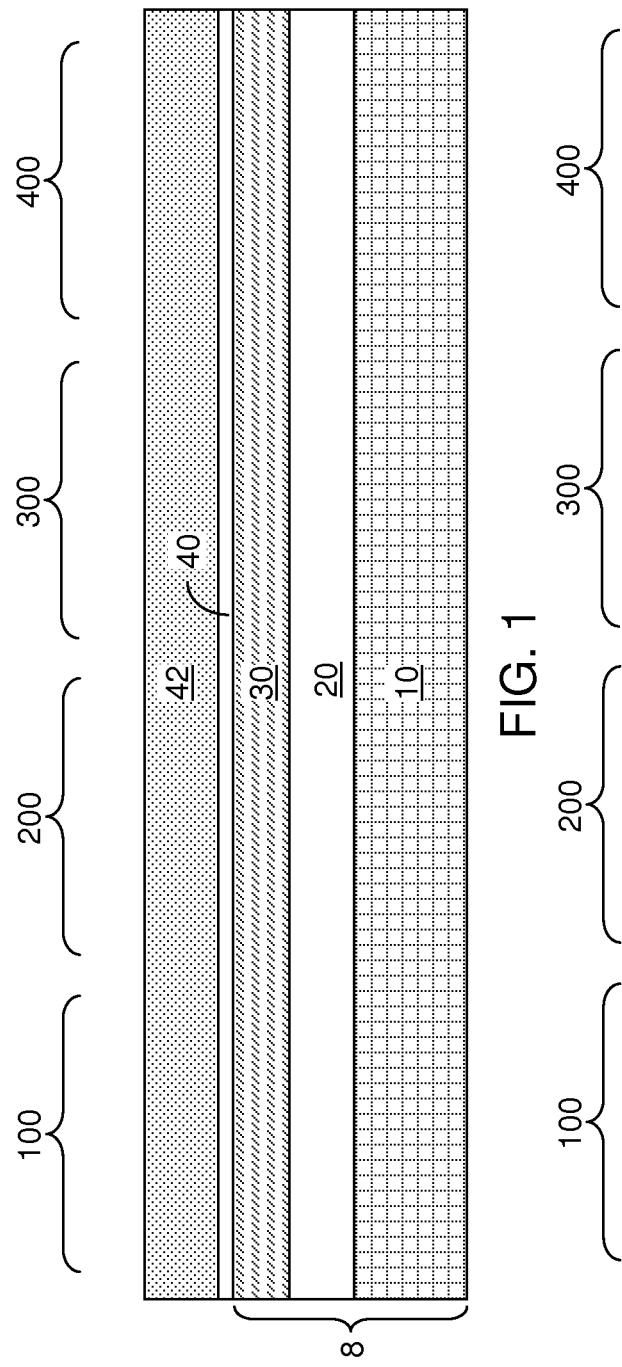
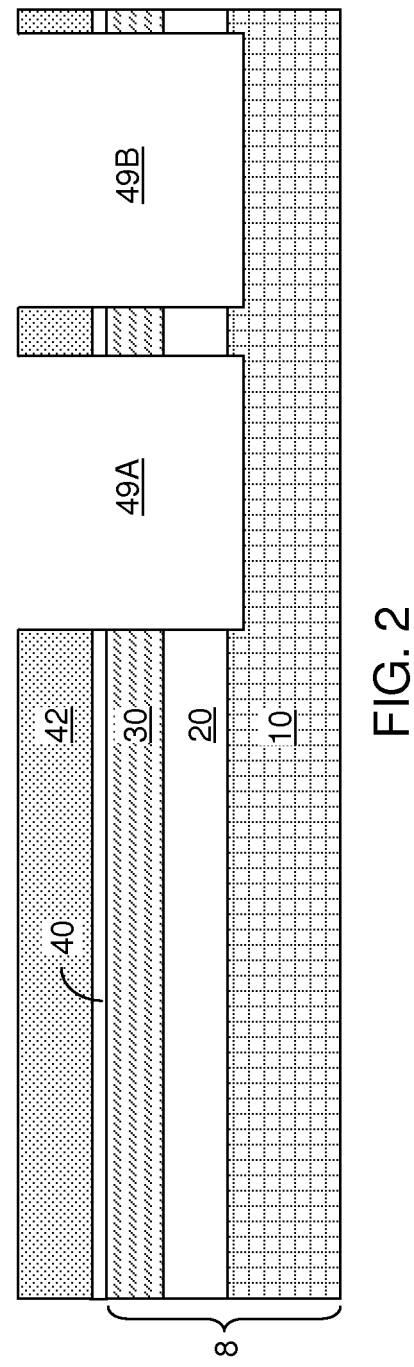

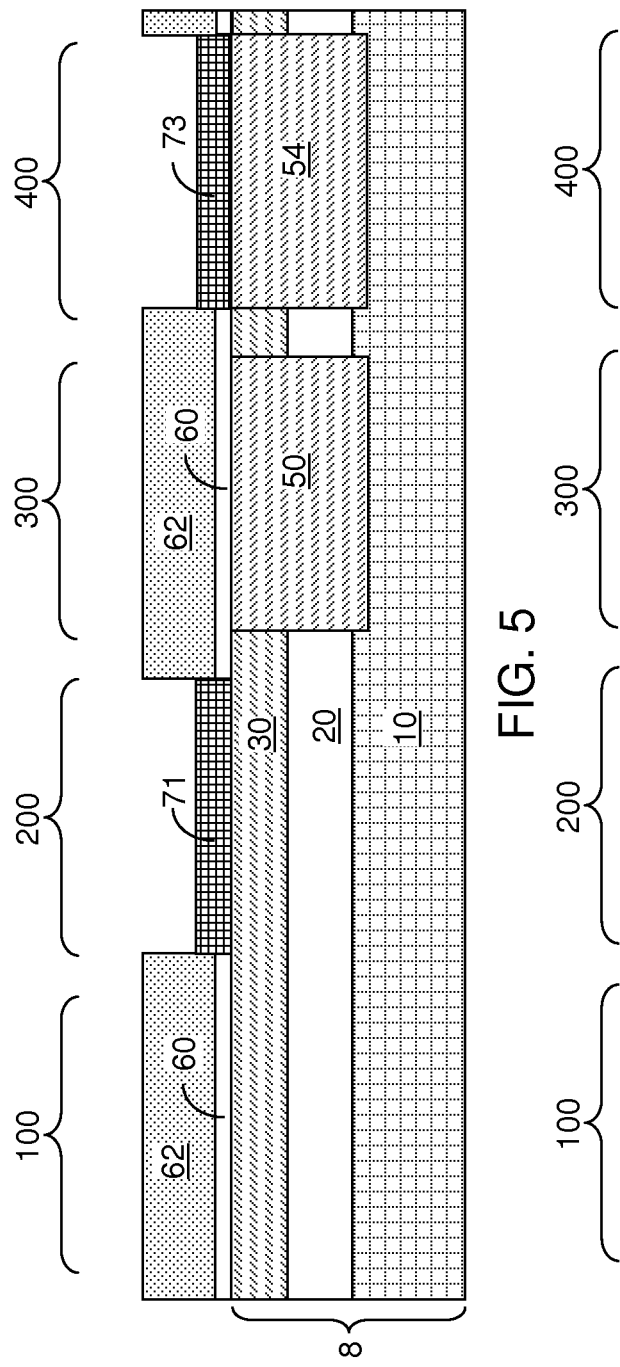
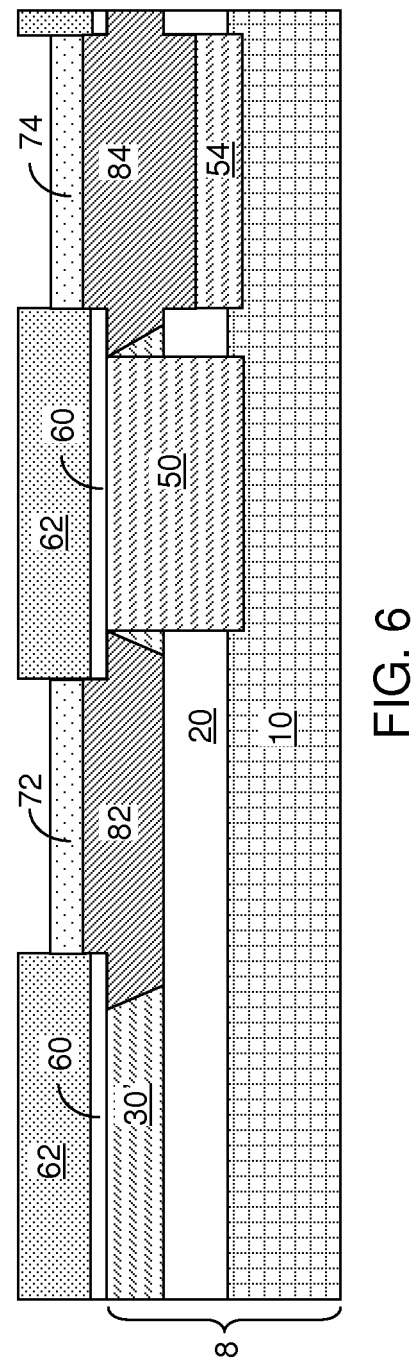

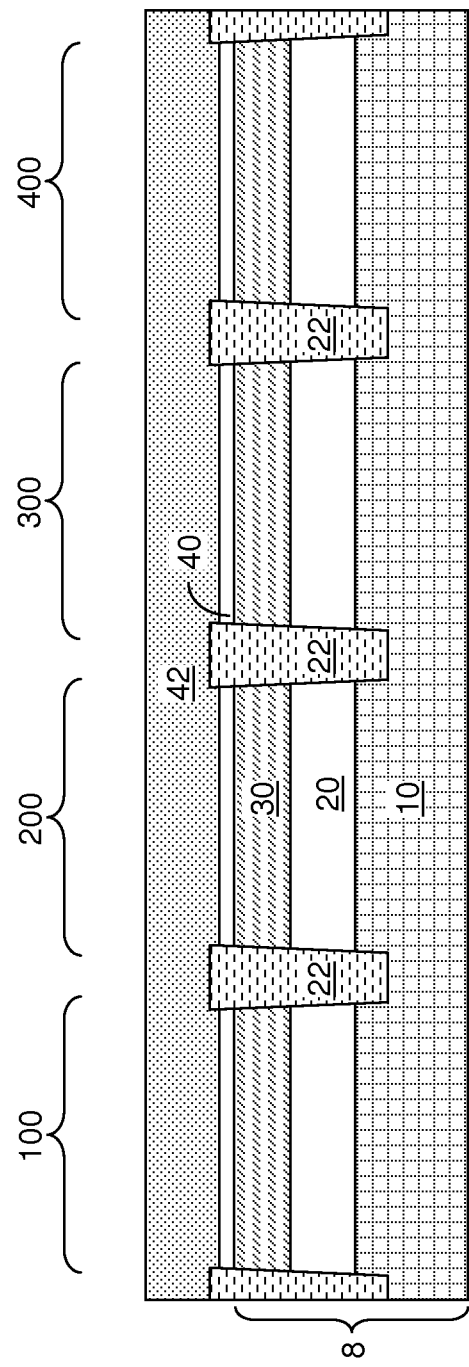
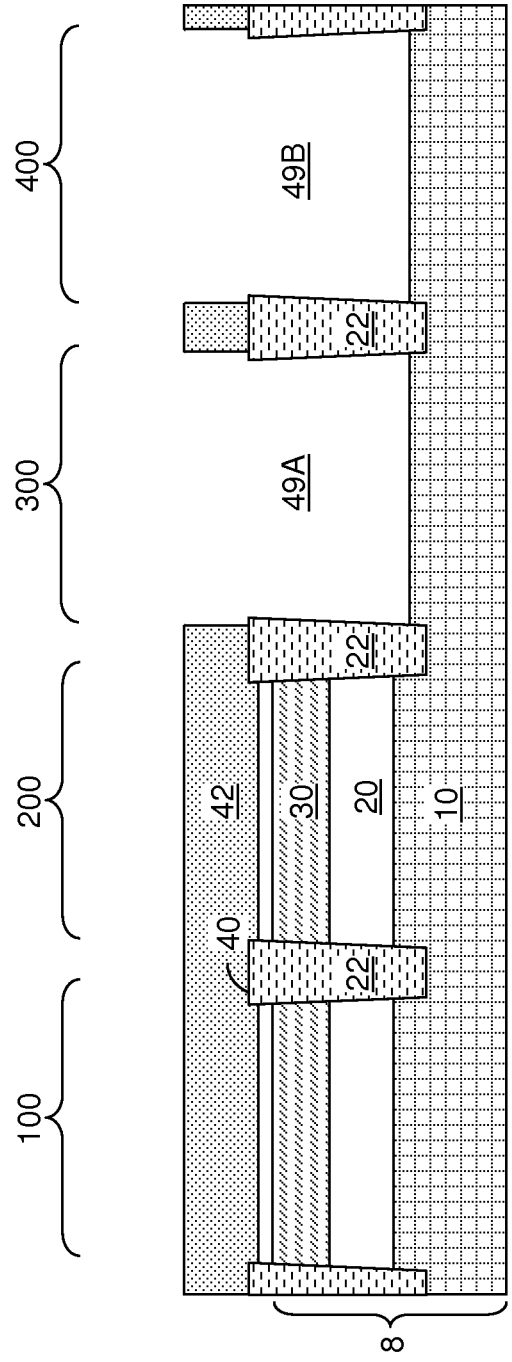

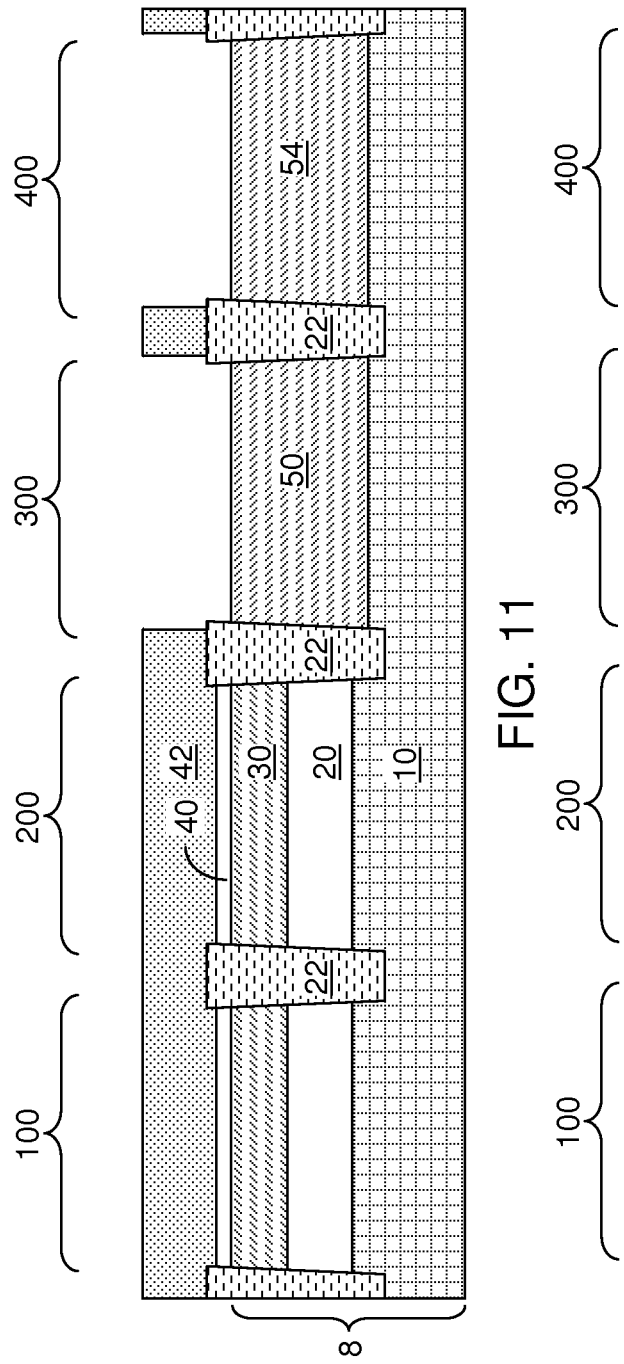
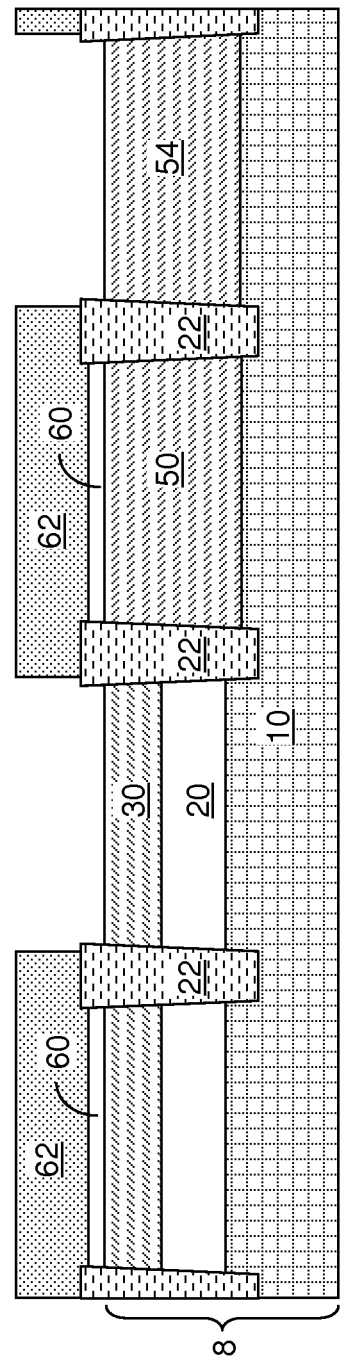
FIG. 11
FIG. 12

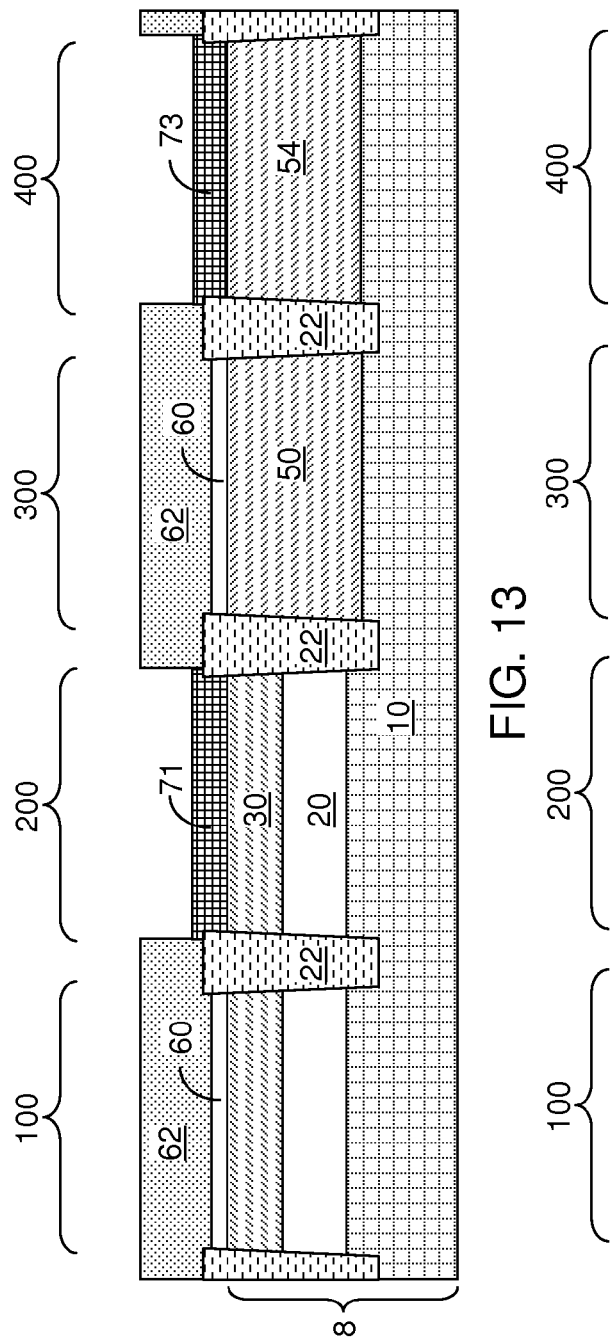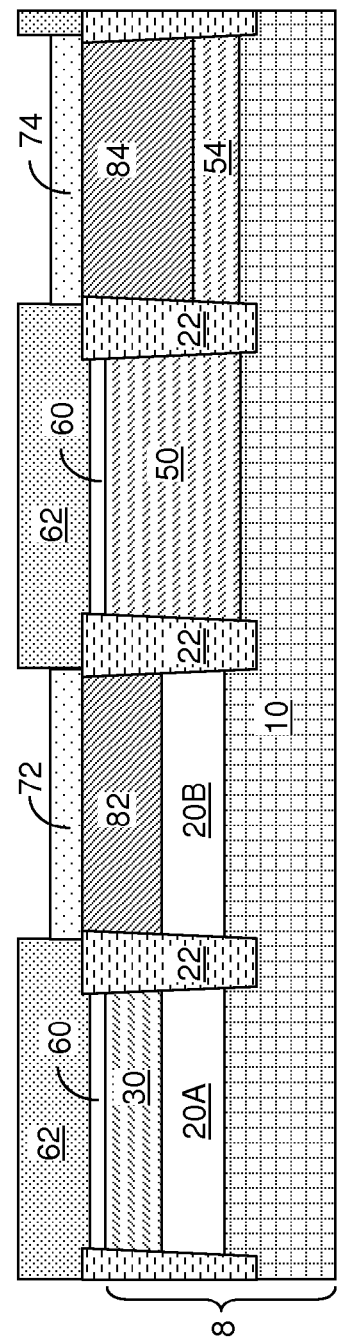
FIG. 13
FIG. 14

DUAL CHANNEL HYBRID SEMICONDUCTOR-ON-INSULATOR SEMICONDUCTOR DEVICES

BACKGROUND

The present invention relates to a semiconductor structure, and more particularly to a semiconductor structure including hybrid semiconductor-on-insulator (SOI) semiconductor devices employing two types of channel materials, and a method of manufacturing the same.

A hybrid SOI substrate refers to a substrate including a first portion that is like a bulk substrate and a second portion that is like an SOI substrate. Typically, an SOI substrate is patterned to remove a buried insulator layer within a region corresponding to the area of the second portion, while retaining the buried insulator layer within a region corresponding to the area of the first portion. The first portion is referred to as a bulk portion, and the second portion is referred to as an SOI portion. Semiconductor devices formed on the SOI portion can be employed to provide fast switching speeds, while semiconductor devices formed on the bulk portion can be employed to provide large on-current. While the use of a hybrid SOI substrate provides benefits in performance metrics, additional performance improvement in performance of semiconductor devices is desired.

SUMMARY

Trenches are formed through a top semiconductor layer and a buried insulator layer of a semiconductor-on-insulator (SOI) substrate. A selective epitaxy is performed to form bulk semiconductor portions filling the trenches and in epitaxial alignment with the semiconductor material of a handle substrate. At least one dielectric layer is deposited over the top semiconductor layer and the bulk semiconductor portions, and is patterned to form openings over selected areas of the top semiconductor layer and the bulk semiconductor portions. A semiconductor alloy material is deposited within the openings directly on physically exposed surfaces of the top semiconductor layer and the bulk semiconductor portions. The semiconductor alloy material intermixes with the underlying semiconductor materials in a subsequent anneal. Within each of the SOI region and the bulk region, two types of semiconductor material portions are formed depending on whether a semiconductor material intermixes with the semiconductor alloy material.

According to an aspect of an embodiment of the present invention, a semiconductor structure is provided. The semiconductor structure includes a handle substrate including a single crystalline semiconductor material, material portions that are located on the handle substrate, and shallow trench isolation structures located on the handle substrate. A first material portion can be located in a first region of the semiconductor structure, and can contain a first buried insulator portion and a first semiconductor-on-insulator (SOI) portion that includes a first semiconductor material. A second material portion can be located in a second region of the semiconductor structure, and can contain a second buried insulator portion and a second SOI portion including an alloy of the first semiconductor material and another semiconductor material. A third material portion can be located in a third region of the semiconductor structure, and can contain an epitaxial semiconductor material portion including a second semiconductor material that is epitaxially aligned to the single crystalline semiconductor material in the handle substrate. A fourth material portion can be located in a fourth region of the semiconductor structure, and can include at least an epitaxial semiconductor alloy portion containing an alloy of the second semiconductor material and the other semiconductor material. The material portions can be laterally spaced from one another by shallow trench isolation structures.

According to another aspect of an embodiment of the present invention, a method of forming a semiconductor structure is provided. At least one trench can be formed through a top semiconductor layer and a buried insulator layer of a semiconductor-on-insulator (SOI) substrate. The top semiconductor layer contains a first semiconductor material. At least one epitaxial semiconductor portion containing a second semiconductor material can be formed in the at least one trench. At least one dielectric layer can be formed, which includes a first opening over a remaining portion of the top semiconductor layer and a second opening over a portion of the at least one epitaxial semiconductor portion. A semiconductor alloy material is deposited on physically exposed surfaces of the first semiconductor material and the second semiconductor material within the first and second openings. The semiconductor alloy material includes another semiconductor material that is different from the first semiconductor material and the second semiconductor material. An SOI portion including an alloy of the first semiconductor material and the other semiconductor material and an epitaxial semiconductor alloy portion including an alloy of the second semiconductor material and the another semiconductor material can be simultaneously formed by diffusion of the semiconductor alloy material into underlying semiconductor materials.

BRIEF DESCRIPTION OF SEVERAL VIEWS OF THE DRAWINGS

FIG. 1 is a vertical cross-sectional view of a first exemplary semiconductor structure after formation of dielectric pad layers over a semiconductor-on-insulator (SOI) substrate according to a first embodiment of the present invention.

FIG. 2 is a vertical cross-sectional view of the first exemplary semiconductor structure after patterning the dielectric pad layers and formation of trenches through a top semiconductor layer and a buried insulator layer according to the first embodiment of the present invention.

FIG. 5 is a vertical cross-sectional view of the first exemplary semiconductor structure after formation of semiconductor alloy material portions by selective epitaxy according to the first embodiment of the present invention.

FIG. 6 is a vertical cross-sectional view of the first exemplary semiconductor structure after conversion of converting the semiconductor alloy material portions into dielectric semiconductor compound material portions and formation of semiconductor alloy material portions by drive-in of a semiconductor material in the semiconductor alloy material portions according to the first embodiment of the present invention.

FIG. 9 is a vertical cross-sectional view of a second exemplary semiconductor structure after formation of shallow trench isolation structures in a semiconductor-on-insulator (SOI) substrate and subsequent formation of dielectric pad layers on the SOI substrate according to a second embodiment of the present invention.

FIG. 10 is a vertical cross-sectional view of the second exemplary semiconductor structure after patterning the dielectric pad layers and formation of trenches through a top semiconductor layer and a buried insulator layer according to the second embodiment of the present invention.

FIG. 11 is a vertical cross-sectional view of the second exemplary semiconductor structure after formation of epitaxial semiconductor portions by selective epitaxy according to the second embodiment of the present invention.

FIG. 12 is a vertical cross-sectional view of the second exemplary semiconductor structure after removal of the dielectric pad layers, and formation and patterning of dielectric layers according to the second embodiment of the present invention.

FIG. 13 is a vertical cross-sectional view of the second exemplary semiconductor structure after formation of semiconductor alloy material portions by selective epitaxy according to the second embodiment of the present invention.

FIG. 14 is a vertical cross-sectional view of the second exemplary semiconductor structure after conversion of converting the semiconductor alloy material portions into dielectric semiconductor compound material portions and formation of semiconductor alloy material portions by drive-in of a semiconductor material in the semiconductor alloy material portions according to the second embodiment of the present invention.

DETAILED DESCRIPTION

Figure 3:
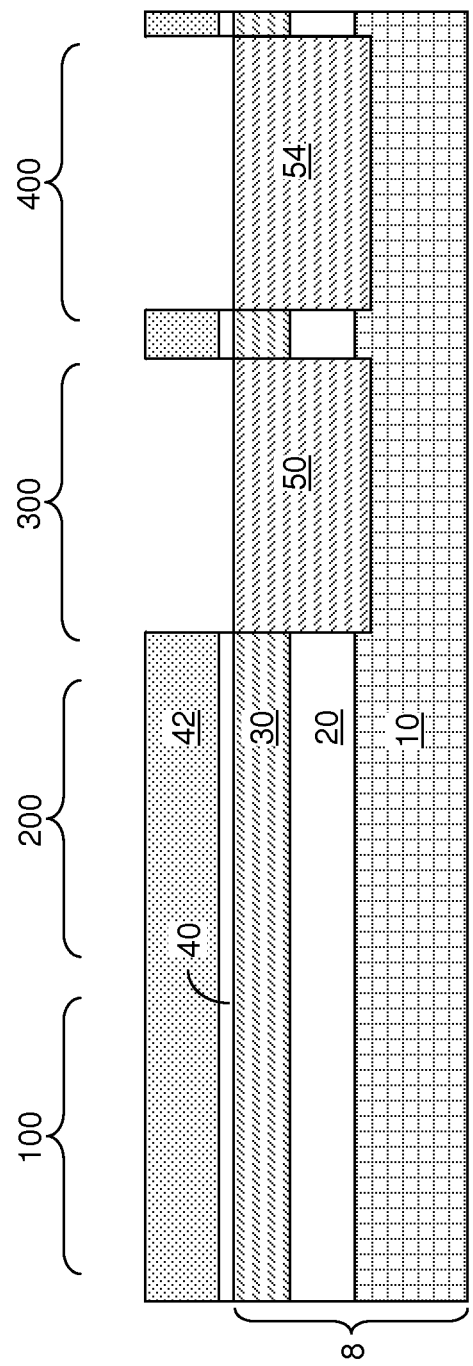
FIG. 3 is a vertical cross-sectional view of the first exemplary semiconductor structure after formation of epitaxial semiconductor portions by selective epitaxy according to the first embodiment of the present invention.

As stated above, the present invention relates to a semiconductor structure including hybrid semiconductor-on-insulator (SOI) semiconductor devices employing two types of channel materials, and a method of manufacturing the same. Aspects of embodiments of the present invention are now described in detail with accompanying figures. It is noted that like reference numerals refer to like elements across different embodiments. The drawings are not necessarily drawn to scale.

Referring to 1, a first exemplary semiconductor structure according to an embodiment of the present invention illustrates a semiconductor-on-insulator (SOI) substrate 8, which includes a stack, from bottom to top, of a handle substrate 10, a buried insulator layer 20, and a top semiconductor layer 30. The handle substrate 10 can include a single crystalline semiconductor material. The handle substrate 10 provides mechanical support to the buried insulator layer 20 and the top semiconductor layer 30. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed. The interface between the buried insulator 20 and the handle substrate 10 can be a planar surface, i.e., a surface within a two-dimensional Euclidean plane. The thickness of the buried insulator layer 20 can be from 5 nm to 100 nm, although lesser and greater thicknesses can also be employed.

The top semiconductor layer 30 is a semiconductor material layer. The semiconductor material of the top semiconductor layer 30 is herein referred to as a first semiconductor material. The first semiconductor material can be an elemental semiconductor material, an alloy including at least one elemental semiconductor material, or a compound semiconductor material. For example, the first semiconductor material can be silicon, germanium, a silicon-germanium alloy, a silicon-carbon alloy, gallium arsenide, or indium arsenide. The first semiconductor material may, or may not, be doped with p-type dopants and/or n-type dopants. The entirety of the first semiconductor material can be single crystalline. In one embodiment, the first semiconductor material can be single crystalline silicon. The thickness of the top semiconductor layer 30 can be from 5 nm to 100 nm, although lesser and greater thicknesses can also be employed.

Dielectric pad layers (40, 42) can be formed on the top surface of the SOI substrate 8. The dielectric pad layers (40, 42) can include, for example, a first dielectric pad layer 40 and a second dielectric pad layer 42. The first dielectric pad layer 40 can be, for example, a silicon oxide layer having a thickness in a range from 1 nm to 10 nm. The second dielectric pad layer 42 can be, for example, a silicon nitride layer having a thickness in a range from 3 nm to 600 nm. The first and second dielectric pad layers (40, 42) can be formed, for example, by chemical vapor deposition (CVD).

The first exemplary semiconductor structure can include a plurality of device regions for forming semiconductor devices. The plurality of device regions can include, for example, a first region 100, a second region 200, a third region 300, and a fourth region 400.

Referring to FIG. 2, the dielectric pad layers (40, 42) are patterned to form openings therein. The openings formed in the dielectric pad layers (40, 42) can include a first opening formed within the third region 300 and a second opening formed in the fourth region 400. The openings in the dielectric pad layers (40, 42) can be formed, for example, by applying a photoresist layer (not shown) over the top surface of the dielectric pad layers (40, 42), lithographically patterning the photoresist layer to form openings therein, and by etching physically exposed portions of the dielectric pad layers (40, 42) employing the patterned photoresist layer as an etch mask. An anisotropic etch or an isotropic etch may be employed to transfer the pattern in the patterned photoresist layer through the dielectric pad layers (40, 42).

Trenches (49A, 49B) are formed in the SOI substrate 8 by transferring the pattern in the dielectric pad layers (40, 43) through the top semiconductor layer 30 and the buried insulator layer 20. The transfer of the pattern can be performed by at least one anisotropic etch, at least one isotropic etch, or a combination thereof. Different etch chemistries can be employed to etch the top semiconductor layer 30 and the buried insulator layer 20. The trenches (49A, 49B) can include a first trench 49A formed within the third region 300 and a second trench 49B formed within the fourth region 400. The trenches (49A, 49B) extend from the top surface of the top semiconductor layer 30 at least to the plane of the interface between the handle substrate 10 and the buried insulator layer 20. In one embodiment, the trenches (49A, 49B) can extend into an upper portion of the handle substrate 10, i.e., recessed bottom surfaces of the trenches (49A, 49B) can be located at a plane lower than the plane including the interface between the handle substrate 10 and the buried insulator layer 20. The area of each trench (49A, 49B) can be selected to enable formation of at least one semiconductor device in the area.

Referring to FIG. 3, epitaxial semiconductor portions (50, 54) are deposited within the trenches (49A, 49B) by selective epitaxy. The epitaxial semiconductor portions (50, 54) can include, for example, a first epitaxial semiconductor portion 50 that is formed within the first trench 49A and a second epitaxial semiconductor portion 54 that is formed within the second trench 49B. The first and second epitaxial semiconductor portions (50, 54) include another single crystalline semiconductor material that is epitaxially aligned to the single crystalline semiconductor material of the handle substrate 10. The single crystalline semiconductor material of the first and second epitaxial semiconductor portions (50, 54) is herein referred to as a second semiconductor material. The second semiconductor material can be the same as, or different from, the semiconductor material of the handle substrate 10. The second semiconductor material can be an elemental semiconductor material, an alloy including at least one elemental semiconductor material, or a compound semiconductor material. For example, the second semiconductor material can be silicon, germanium, a silicon-germanium alloy, a silicon-carbon alloy, gallium arsenide, or indium arsenide. The second semiconductor material may, or may not, be doped with p-type dopants and/or n-type dopants. In one embodiment, the second semiconductor material can be single crystalline silicon. In one embodiment, the first and second semiconductor materials can be single crystalline silicon. The selective epitaxy of the second semiconductor material can be performed, for example, by simultaneously or alternately flowing a semiconductor precursor gas (such as $SiH_4$, $GeH_4$, $C_2H_2$) and an etchant gas (such as HCl) with an optional carrier gas (such as $H_2$ or $N_2$) in a reaction chamber.

The top surface of the deposited second semiconductor material within each trench (49A, 49B) is formed above the horizontal plane including the interface between the buried insulator layer 20 and the top semiconductor layer 30. In one embodiment, the top surface of the deposited second semiconductor material within each trench (49A, 49B) can be formed above the horizontal plane including the top surface of the top semiconductor layer 30. In one embodiment, the top surface of the deposited second semiconductor material within each trench (49A, 49B) can be formed above the horizontal plane including the top surface of the second dielectric pad layer 42 or above the horizontal plane including the top surface of the first dielectric pad layer 40. A planarization process can be employed to planarize the deposited second semiconductor material employing the top surface of the second dielectric pad layer 42 as a stopping layer. Top surfaces of the epitaxial semiconductor portions (50, 54) may be optionally recessed. Additionally or alternatively, the second dielectric pad layer 42 can be removed selective to the first dielectric pad layer 40, and a planarization process can be employed to planarize the deposited second semiconductor material employing the top surface of the first dielectric pad layer 40 as a stopping layer. Top surfaces of the epitaxial semiconductor portions (50, 54) may be optionally recessed. Additionally or alternatively, the first and second dielectric pad layers (40, 42) may be removed selective to the first semiconductor material of the top semiconductor layer 30 and the second semiconductor material of the epitaxial semiconductor portions (50, 54), and a touch-up planarization process may be performed to provide a planar surface to the epitaxial semiconductor portions (50, 54) such that the planarized top surfaces of the epitaxial semiconductor portions (50, 54) are coplanar with (i.e., located within a same two-dimensional plane as) the top surface of the top semiconductor layer 30. Any remaining portion of the dielectric pad layers (40, 42) is subsequently removed.

Figure 4:
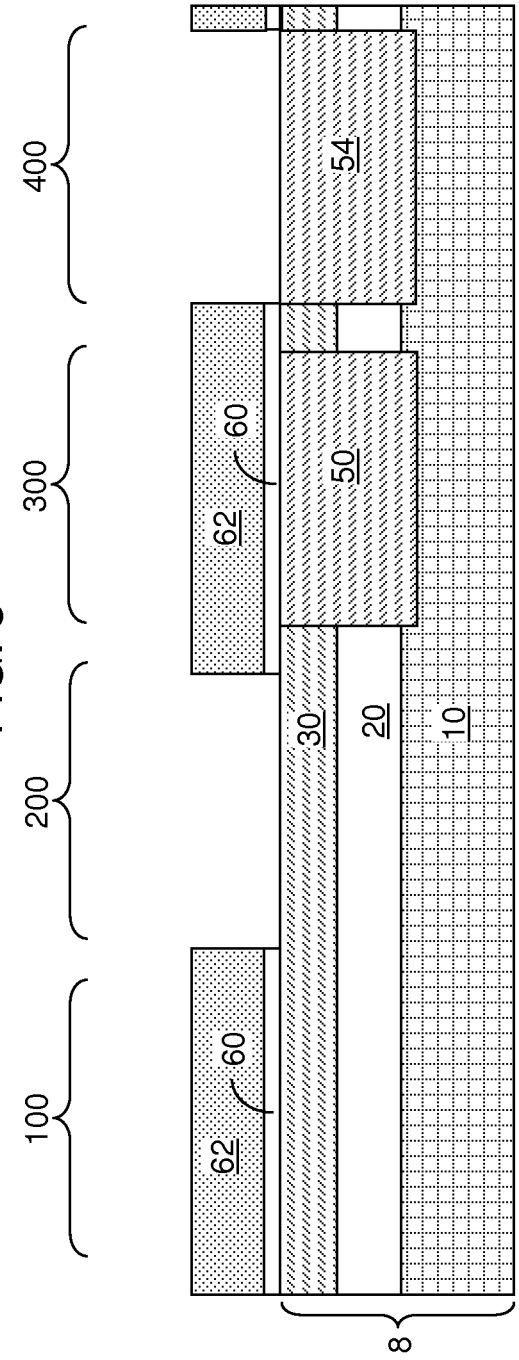
FIG. 4 is a vertical cross-sectional view of the first exemplary semiconductor structure after removal of the dielectric pad layers, and formation and patterning of dielectric layers according to the first embodiment of the present invention.

Referring to FIG. 4, dielectric layers (60, 62) are deposited over the top semiconductor layer 30 and the epitaxial semiconductor portions (50, 54). The dielectric layers (60, 62) can include, for example, a first dielectric layer 60 and a second dielectric layer 62. The first dielectric layer 60 can be, for example, a silicon oxide layer having a thickness in a range from 1 nm to 10 nm. The second dielectric layer 62 can be, for example, a silicon nitride layer having a thickness in a range from 3 nm to 600 nm. The first and second dielectric layers (60, 62) can be formed, for example, by chemical vapor deposition (CVD).

The dielectric layers (60, 62) are patterned to form openings therein. The openings formed in the dielectric layers (60, 62) can include a first opening formed within the second region 200 and a second opening formed in the fourth region 400. The openings in the dielectric layers (60, 62) can be formed, for example, by applying a photoresist layer (not shown) over the top surface of the dielectric layers (60, 62), lithographically patterning the photoresist layer to form openings therein, and by etching physically exposed portions of the dielectric layers (60, 62) employing the patterned photoresist layer as an etch mask. An anisotropic etch or an isotropic etch may be employed to transfer the pattern in the patterned photoresist layer through the dielectric layers (60, 62). After transfer of the pattern in the photoresist layer into the dielectric layers (60, 62), the dielectric layers (60, 62) include a first opening located over a remaining portion of the top semiconductor layer 30 and a second opening located over a portion of the second epitaxial semiconductor portion 54. A portion of the top surface of the top semiconductor layer 30 is physically exposed within the first opening in the dielectric layers (60, 62) in the second region 200. A portion of the top surface of the second epitaxial semiconductor portion 54 is physically exposed within the second opening in the dielectric layers (60, 62).

Referring to FIG. 5, a semiconductor alloy material is deposited on physically exposed surfaces of the first semiconductor material and the second semiconductor material within the first and second openings in the dielectric layers (60, 62). The semiconductor alloy material includes a semiconductor material that is different from the first semiconductor material and the second semiconductor material. In one embodiment, the semiconductor material that is different from the first semiconductor material and the second semiconductor material can be selected from germanium and carbon. As used herein, carbon is considered a semiconductor element to the degree that carbon can provide a semiconducting material when alloyed with other semiconductor materials such as silicon or germanium. As used herein, a material is semiconducting if the resistivity of the material is in a range from $1.0 \times 10^{-4}$ Ohm-cm to $1.0 \times 10^4$ Ohm-cm. In one embodiment, the semiconductor material that is different from the first semiconductor material and the second semiconductor material can be germanium. In another embodiment, the semiconductor material that is different from the first semiconductor material and the second semiconductor material can be carbon.

Semiconductor alloy material portions (71, 73) can be formed within the openings in the dielectric layers (60, 62) by selective epitaxy of the semiconductor alloy material. The semiconductor alloy material portions (71, 73) can include, for example, a first semiconductor alloy material portion 71 that is formed within the first opening in the second region 200, and a second semiconductor alloy material portion 73 that is formed within the second opening in the fourth region 400.

The semiconductor alloy material of the first and second semiconductor alloy material portions (71, 73) may be single crystalline and epitaxially aligned to the first semiconductor material and/or the second semiconductor material. Alternately, the semiconductor alloy material of the first and second semiconductor alloy material portions (71, 73) may be polycrystalline. In one embodiment, the semiconductor alloy material may can include all of the elements in the first semiconductor material and additionally include another element, which can be, for example, germanium or carbon if the first semiconductor material is silicon, and can be indium, aluminum, gallium, phosphorus, arsenic, or antimony if the first semiconductor material is a III-V compound semiconductor material.

In one embodiment, the semiconductor alloy material may include all of the elements in the second semiconductor material and additionally include another element, which can be, for example, germanium or carbon if the second semiconductor material is silicon, and can be indium, aluminum, gallium, phosphorus, arsenic, or antimony if the second semiconductor material is a III-V compound semiconductor material. The first semiconductor material and the second semiconductor material may be the same. In one embodiment, the first semiconductor material and the second semiconductor material can be single crystalline silicon, and the semiconductor alloy material can be a silicon-germanium alloy or a silicon-carbon alloy. In one embodiment, the first semiconductor material and the second semiconductor material can be GaAs, and the semiconductor alloy material can be, for example, InGaAs, GaAlAs, GaAsP, or GsAsSb. The semiconductor alloy material may, or may not, be doped with p-type dopants and/or n-type dopants.

The selective epitaxy of the semiconductor alloy material can be performed, for example, by simultaneously or alternately flowing at least two semiconductor precursor gas (such as a combination of $SiH_4$ and $GeH_4$, or a combination of $SiH_4$ and $C_2H_2$) and an etchant gas (such as HCl) with an optional carrier gas (such as $H_2$ or $N_2$) in a reaction chamber. The thickness of the first and second semiconductor alloy material portions (71, 73) can be in a range from 5 nm to 500 nm, although lesser and greater thicknesses can also be employed.

Referring to FIG. 6, at least an upper portion of each semiconductor alloy material portion (71, 73) is converted into dielectric semiconductor compound material portions (72, 74). The dielectric semiconductor compound material portions (72, 74) can include a first dielectric semiconductor compound material portion 72 that is formed by conversion of at least an upper portion of the first semiconductor alloy material portion 71, and a second dielectric semiconductor compound material portion 74 that is formed by conversion of at least an upper portion of the second semiconductor alloy material portion 73. The dielectric semiconductor compound material portions (72, 74) include an oxide, a nitride, or an oxynitride of the semiconductor alloy material of the first and second semiconductor alloy material portions (71, 73), and can be formed by thermal oxidation, plasma oxidation, thermal nitridation, plasma nitridation, or a combination thereof.

A drive-in anneal process can be performed concurrently with, or subsequent to, conversion of the semiconductor alloy material portions (71, 73) into dielectric semiconductor compound material portions (72, 74). In one embodiment, a thermal oxidation process and/or a thermal nitridation process can be employed to convert the semiconductor alloy material portions (71, 73) into dielectric semiconductor compound material portions (72, 74), and the thermal oxidation process and/or the thermal nitridation process can be a drive-in anneal process. In another embodiment, a plasma oxidation process and/or a plasma nitridation process can be employed to convert the semiconductor alloy material portions (71, 73) into dielectric semiconductor compound material portions (72, 74), and a subsequent thermal oxidation process and/or a subsequent thermal nitridation process can be a drive-in anneal process. The temperature of the drive-in anneal process can be in a range from 650° C. to 1,100° C., although lesser and greater temperatures can also be employed.

The semiconductor alloy material of the semiconductor alloy material portions (71, 73) is converted into a dielectric semiconductor compound material prior to, or during, the diffusion of the semiconductor alloy material into the underlying semiconductor materials. During the drive-in anneal process, the semiconductor alloy material in the semiconductor alloy material portions (71, 73) diffuse into underlying semiconductor material portions. Particularly, the additional semiconductor element (such as germanium or carbon for elemental semiconductor materials or indium, aluminum, gallium, phosphorus, arsenic, or antimony for compound semiconductor materials) that is not present in the first semiconductor material or in the second semiconductor material can diffuse into the portions of the first semiconductor material and the second semiconductor material that underlie the semiconductor alloy material portions (71, 73).

A semiconductor-on-insulator (SOI) portion 82 is formed by diffusion of the additional semiconductor element from the first semiconductor alloy material portion 71 into an underlying portion of the top semiconductor layer 30 that remains prior to the drive-in anneal. The SOI portion 82 includes all elements present in the first semiconductor material and the additional semiconductor element. Any remaining portion of the first semiconductor alloy material portion 71 is incorporated into the SOI portion 83 during the drive-in anneal.

An epitaxial semiconductor alloy portion 84 is formed by diffusion of the additional semiconductor element from the second semiconductor alloy material portion 73 into at least an upper portion second epitaxial semiconductor portion 54 during the drive-in anneal. In other words, the portion of the second epitaxial semiconductor portion 54 into which the additional semiconductor element diffuses is converted into the epitaxial semiconductor alloy portion 84. The epitaxial semiconductor alloy portion 84 includes all elements present in the second semiconductor material and the additional semiconductor element. In one embodiment, a remaining portion of the second epitaxial semiconductor portion 54 can be present after the drive-in anneal. In another embodiment, the entirety of the second epitaxial semiconductor portion 54 can be converted into the epitaxial semiconductor alloy portion 84.

The remaining portion of the top semiconductor layer 30 constitutes another SOI portion, which does not include the additional semiconductor material within the SOI portion 82. Further, the first epitaxial semiconductor portion 50 does not include the additional semiconductor material within the epitaxial semiconductor alloy portion 84.

Figure 7:
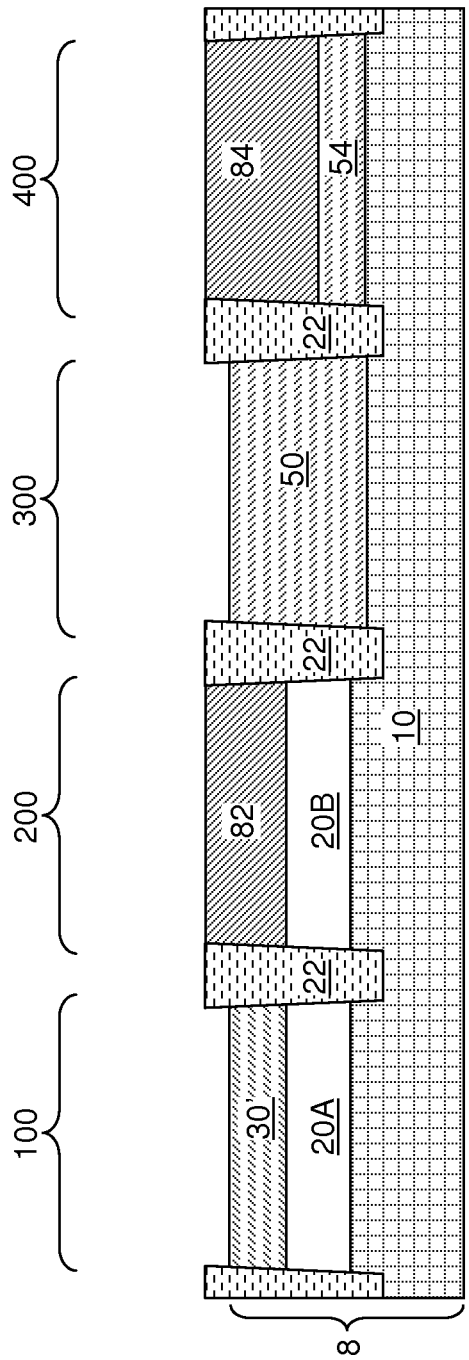
FIG. 7 is a vertical cross-sectional view of the first exemplary semiconductor structure after formation of shallow trench isolation structures according to the first embodiment of the present invention.

Referring to FIG. 7, various shallow trench isolation structures 22 are formed in the SOI substrate 8, for example, by formation of shallow trenches, filling of the shallow trenches with a dielectric material, and by removal of excess dielectric material from above a horizontal plane. The dielectric semiconductor compound material portions (72, 74) and the dielectric layers (60, 62) can be removed selective to the various semiconductor materials underneath prior to, during, or after formation of the various shallow trench isolation structures 22.

In one embodiment, the dielectric semiconductor compound material portions (72, 74) and the dielectric layers (60, 62) can be removed selective to the various semiconductor materials underneath prior to formation of the shallow trench isolation structures 22. The shallow trench isolation structures 22 can be formed employing methods known in the art. For example, a dielectric material stack such as a silicon oxide layer and a silicon nitride layer can be formed above the semiconductor surfaces of the top semiconductor layer 30, the SOI portion 82, the first epitaxial semiconductor portion 50, and the epitaxial semiconductor alloy portion 84, and shallow trenches can be formed through the silicon nitride layer, the silicon oxide layer, and the upper portion of the SOI substrate 8. In one embodiment, the shallow trench isolation structures may extend to a depth below the interface between the buried insulator layer 20 and the handle substrate 8.

In another embodiment, shallow trenches can be formed through the dielectric semiconductor compound material portions (72, 74) and the dielectric layers (60, 62), and shallow trench isolation structures 22 can be formed by filling the shallow trenches with a dielectric material such as silicon oxide. The dielectric semiconductor compound material portions (72, 74) and the dielectric layers (60, 62) can be subsequently removed selective to the various semiconductor materials underneath after formation of the shallow trench isolation structures 22.

Various material portions electrically isolated from one another are formed within the SOI substrate 8 of the first exemplary semiconductor structure. A first material portion (20A, 30) is located in the first region 100 and includes a first buried insulator portion 20A (which is a remaining portion of the buried insulator layer 20) and a remaining portion of the top semiconductor layer 30 (which is herein referred to as a first SOI portion). A second material portion (20B, 82) is located in the second region 200, and includes a second buried insulator portion 20B and the SOI portion 82 (which is herein referred to as a second SOI portion). The SOI portion 82 includes an alloy of the first semiconductor material and the additional semiconductor material derived from the third semiconductor material. A third material portion 50 is located in the third region 300 and includes the first epitaxial semiconductor material portion 50, which includes the second semiconductor material that is epitaxially aligned to the single crystalline semiconductor material in the handle substrate 10. A fourth material portion (54, 84) is located in the fourth region, and includes at least the epitaxial semiconductor alloy portion 84 containing an alloy of the second semiconductor material and the additional semiconductor material derived from the third semiconductor material. The fourth material portion (54, 84) can optionally include another epitaxial semiconductor material portion (i.e., a remaining portion of the second epitaxial semiconductor material portion 54). The second epitaxial semiconductor material portion 54, if present, contacts the handle substrate 10 and the epitaxial semiconductor alloy portion 84, and contains the second semiconductor material and does not contain the additional semiconductor material of the third semiconductor material.

In one embodiment, top surfaces of the first and second buried insulator portions (20A, 20B) are coplanar with each other, and bottom surfaces of the first and second buried insulator portions (20A, 20B) are coplanar with each other. A top surface of the first epitaxial semiconductor portion 50 can be located above a horizontal plane including the top surfaces of the first buried insulator portion 20A and the second buried insulator portion 20B. In one embodiment, the top surface of the first SOI portion 30 can be located below the horizontal plane including the top surface of the second SOI portion 82.

Figure 8:
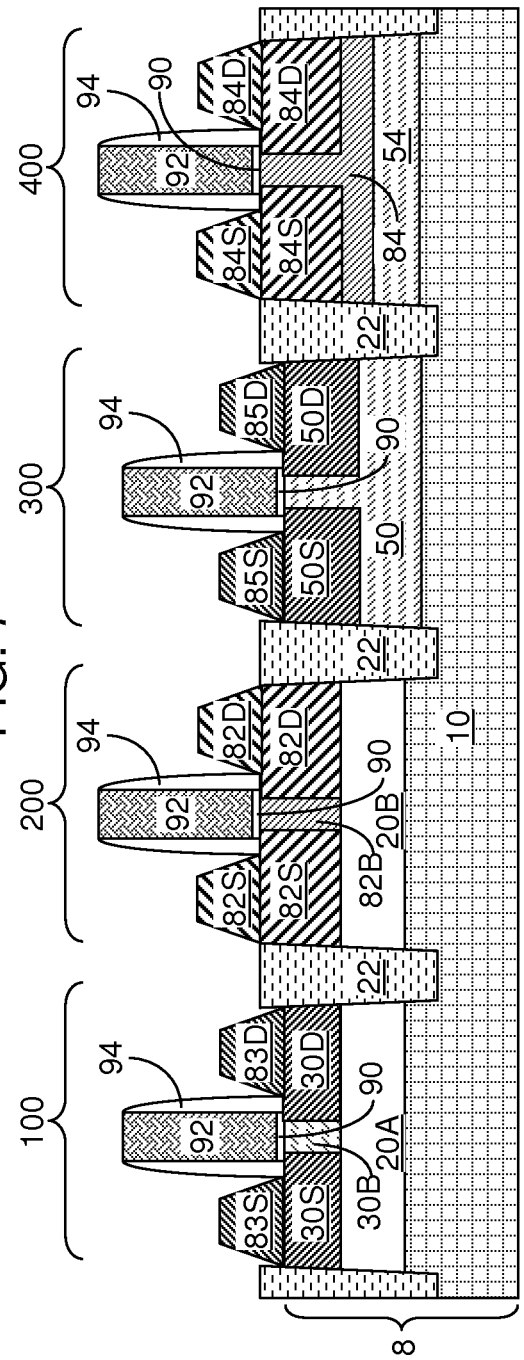
FIG. 8 is a vertical cross-sectional view of the first exemplary semiconductor structure after formation of field effect transistors according to the first embodiment of the present invention.

Referring to FIG. 8, field effect transistors can be formed in the various regions (100, 200, 300, 400) of the first exemplary semiconductor structure. For example, a first source region 30S, a first drain region 30D, and a first body region 30B of a first field effect transistor can be formed in the first SOI portion 30 in the first region 100. A second source region 82S, a second drain region 82D, and a second body region 82B of a second field effect transistor can be formed in the second SOI portion 82 in the second region 200. A third source region 50S and a third drain region 50D of a third field effect transistor can be formed in the first epitaxial semiconductor material portion 50 in the third region 300. A fourth source region 84S and a fourth drain region 84D of a fourth field effect transistor can be formed in the epitaxial semiconductor alloy portion 84 in the fourth region 400.

A gate stack including a gate dielectric 90 and a gate electrode 94 can be formed over each body region of the field effect transistors. Gate spacers 94 can be formed as needed. Optionally, a first raised source region 83S and a first raised drain region 83D can be formed on the first field effect transistor. A second raised source region 82S and a second raised drain region 82D can be formed on the second field effect transistor. A third raised source region 85S and a third raised drain region 85D can be formed on the third field effect transistor. A fourth raised source region 84S and a fourth raised drain region 84D can be formed on the fourth field effect transistor.

Referring to FIG. 9, a second exemplary semiconductor structure according to a second embodiment of the present invention can be derived from the first exemplary semiconductor structure by forming shallow trench isolation structures 22 in a semiconductor-on-insulator (SOI) substrate prior to formation of dielectric pad layers (40, 42) on the SOI substrate 8. The SOI substrate 8 can be the same as in the first embodiment. After providing an SOI substrate 8 including a handle substrate 10, a buried insulator layer 20, and a top semiconductor layer 30, the formation of the shallow trench isolation structures 22 can be performed employing methods known in the art. Subsequently, the dielectric pad layers (40, 42) are formed in the same manner as in the first embodiment.

Referring to FIG. 10, the processing steps of FIG. 2 can be performed in the same manner as in the first embodiment.

Referring to FIG. 11, the processing steps of FIG. 3 can be performed in the same manner as in the first embodiment.

Referring to FIG. 12, the processing steps of FIG. 4 can be performed in the same manner as in the first embodiment.

Referring to FIG. 13, the processing steps of FIG. 5 can be performed in the same manner as in the first embodiment.

Referring to FIG. 14, the processing steps of FIG. 6 can be performed in the same manner as in the first embodiment.

Subsequently, the dielectric semiconductor compound material portions (72, 74) and the dielectric layers (60, 62) can be removed selective to the various semiconductor materials. The resulting structure can be substantially the same as the first exemplary semiconductor structure illustrated in FIG. 7. The processing steps of FIG. 8 can be subsequently performed.

The exemplary semiconductor structures illustrated herein enable hybrid semiconductor-on-insulator (SOI) semiconductor devices. Two types of channel materials are provided for each of SOI devices and bulk devices. Specifically, for the SOI devices, the first semiconductor material and the alloy of the first semiconductor material and the third semiconductor material is provided. For the bulk devices, the second semiconductor material and the alloy of the second semiconductor material and the third semiconductor material is provided. If the first semiconductor material is the same as the second semiconductor material, two different semiconductor materials can be employed for semiconductor devices. If the first semiconductor material is different from the second semiconductor material, four different semiconductor materials can be employed for semiconductor devices.

While the invention has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the invention is intended to encompass all such alternatives, modifications and variations which fall within the scope and spirit of the invention and the following claims.

What is claimed is:

1. A semiconductor structure comprising:
   a handle substrate comprising a single crystalline semiconductor material; and
   material portions that are located on said handle substrate, wherein said material portions comprise:
   a first material portion located in a first region of said semiconductor structure and including a first buried insulator portion and a first semiconductor-on-insulator (SOI) portion comprising a first semiconductor material;
   a second material portion located in a second region of said semiconductor structure and including a second buried insulator portion and a second SOI portion comprising an alloy of said first semiconductor material and another semiconductor material; and
   a third material portion located in a third region of said semiconductor structure and including an epitaxial semiconductor material portion including a second semiconductor material that is epitaxially aligned to said single crystalline semiconductor material in said handle substrate.

2. The semiconductor structure of claim 1, wherein said material portions further comprise a fourth material portion located in a fourth region of said semiconductor structure, and said fourth material portion comprises at least an epitaxial semiconductor alloy portion containing an alloy of said second semiconductor material and said another semiconductor material.

3. The semiconductor structure of claim 2, wherein said fourth material portion further comprises another epitaxial semiconductor material portion contacting said handle substrate and said epitaxial semiconductor alloy portion and containing said second semiconductor material and not containing said another semiconductor material.

4. The semiconductor structure of claim 2, wherein said another semiconductor material is germanium.

5. The semiconductor structure of claim 2, wherein said another semiconductor material is carbon.

6. The semiconductor structure of claim 2, wherein said first semiconductor material and said second semiconductor material are silicon.

7. The semiconductor structure of claim 2, wherein said semiconductor structure further comprises:
   a first field effect transistor including a first source region and a first drain region that are located in said first SOI portion;
   a second field effect transistor including a second source region and a second drain region that are located in said second SOI portion; and
   a third field effect transistor including a third source region and a third drain region that are located in said epitaxial semiconductor material portion.

8. The semiconductor structure of claim 7, further comprising a fourth field effect transistor including a fourth source region and fourth drain region that are located in said epitaxial semiconductor alloy portion.

9. The semiconductor structure of claim 1, wherein top surfaces of said first and second buried insulator portions are coplanar with each other.

10. The semiconductor structure of claim 9, wherein bottom surfaces of said first and second buried insulator portions are coplanar with each other.

11. The semiconductor structure of claim 1, wherein a top surface of said epitaxial semiconductor portion is located above a horizontal plane including a top surface of said first buried insulator portion and a top surface of said second buried insulator portion.

12. The semiconductor structure of claim 1, wherein a top surface of said first SOI portion is located below a horizontal plane including a top surface of said second SOI portion.

13. The semiconductor structure of claim 1, wherein each material portion is laterally spaced from one another by shallow trench isolation structures.

14. The semiconductor structure of claim 2, wherein each material portion is laterally spaced from one another by shallow trench isolation structures.

* * * * *